(12) United States Patent
Leclair et al.

(10) Patent No.: US 11,736,195 B2
(45) Date of Patent: Aug. 22, 2023

(54) UNIVERSAL SUB SLOT ARCHITECTURE FOR NETWORKING MODULES

(71) Applicant: Ciena Corporation, Hanover, MD (US)

(72) Inventors: Marc Leclair, Gatineau (CA); Mitchell O'Leary, Ottawa (CA); Nicola Benvenuti, Kanata (CA); James McGale, Kanata (CA); Daniel Rivaud, Ottawa (CA); Sheldon Button, Kanata (CA)

(73) Assignee: Ciena Corporation

( * ) Notice: Subject to any disclaimer, the term of this patent is extended or adjusted under 35 U.S.C. 154(b) by 90 days.

(21) Appl. No.: 17/389,766

(22) Filed: Jul. 30, 2021

(65) Prior Publication Data

US 2021/0367674 A1    Nov. 25, 2021

Related U.S. Application Data

(63) Continuation-in-part of application No. 16/391,642, filed on Apr. 23, 2019, now Pat. No. 11,079,559.

(51) Int. Cl.
*H04B 10/40*    (2013.01)
*H04B 10/25*    (2013.01)
*H04B 10/80*    (2013.01)

(52) U.S. Cl.
CPC ............. *H04B 10/40* (2013.01); *H04B 10/25* (2013.01); *H04B 10/801* (2013.01)

(58) Field of Classification Search
CPC ....... H04B 10/25; H04B 10/40; H04B 10/801
USPC ........................................................ 398/164
See application file for complete search history.

(56) References Cited

U.S. PATENT DOCUMENTS

| | | |
|---|---|---|
| 4,699,455 A | 10/1987 | Erbe et al. |
| 5,402,320 A | 3/1995 | Kielstra et al. |
| 5,949,946 A | 9/1999 | Debortoli et al. |
| 5,993,251 A | 11/1999 | Brown et al. |
| 6,421,252 B1 | 7/2002 | White et al. |
| D486,454 S | 2/2004 | Vink-Ellis et al. |
| 6,831,844 B1 | 12/2004 | Lee et al. |
| 6,948,968 B1 | 9/2005 | Shearman et al. |
| 7,023,704 B1 | 4/2006 | Zarnowitz et al. |
| 8,052,335 B2 | 11/2011 | Kasbeer-Betty et al. |
| 8,057,110 B2 * | 11/2011 | Harris ................. G02B 6/4246 385/94 |
| 8,506,176 B2 | 8/2013 | Daikuhara et al. |
| 9,203,782 B2 | 12/2015 | Mayenburg et al. |

(Continued)

*Primary Examiner* — Dalzid E Singh
(74) *Attorney, Agent, or Firm* — Baratta Law PLLC; Lawrence A. Baratta, Jr.

(57) ABSTRACT

A universal sub slot module includes a Printed Circuit Board (PCB) including circuitry for power, a data plane, and a control plane; a faceplate connected to one end of the PCB and connectors connected to another end of the PCB, wherein the connectors are configured to connect to corresponding connectors in a host module; and a form factor containing the PCB and configured to interface a sub slot in the host module configured to operate in a chassis-based or rack mounted unit network element. The host module can include a plurality of sub slots, each being a port having one of the universal sub slot module and a filler module. The data plane can be configured to implement one of Optical Transport Network (OTN), Beyond 100G, Flexible Optical (FlexO), Ethernet, and Flexible Ethernet (FlexE).

20 Claims, 15 Drawing Sheets

(56) References Cited

U.S. PATENT DOCUMENTS

| | | |
|---|---|---|
| 9,295,178 B1* | 3/2016 | Aldea ................... F16B 2/10 |
| 9,606,313 B2 | 3/2017 | Roesner et al. |
| 9,759,235 B2 | 9/2017 | Saturley et al. |
| 9,846,287 B2 | 12/2017 | Mack |
| 10,012,811 B2 | 7/2018 | Rivaud et al. |
| 10,028,407 B2 | 7/2018 | Meunier et al. |
| 10,062,993 B1 | 8/2018 | Lutkiewicz et al. |
| 10,247,895 B2 | 4/2019 | Rivaud et al. |
| 10,761,281 B1* | 9/2020 | Gupta ................ G02B 6/4277 |
| 10,788,630 B2 | 9/2020 | Adiletta et al. |
| 10,795,100 B2 | 10/2020 | Leigh et al. |
| 2003/0185537 A1 | 10/2003 | O'Leary et al. |
| 2008/0239689 A1 | 10/2008 | Okamoto et al. |
| 2009/0016685 A1* | 1/2009 | Hudgins ................ H04B 10/40 |
| | | 385/92 |
| 2017/0126589 A1* | 5/2017 | Estabrooks ...... H04B 10/25891 |
| 2017/0168253 A1* | 6/2017 | Wilcox ................ G02B 6/4278 |
| 2017/0244211 A1 | 8/2017 | Lee et al. |
| 2017/0257970 A1 | 9/2017 | Alleman et al. |
| 2017/0269314 A1 | 9/2017 | Gaal |

\* cited by examiner

FIG. 2A
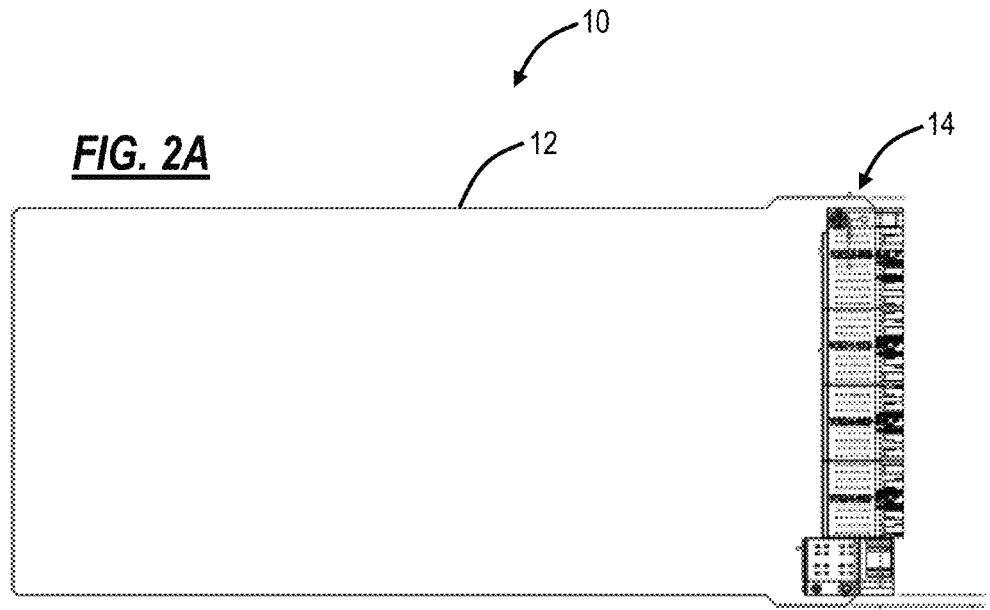
FIG. 2B
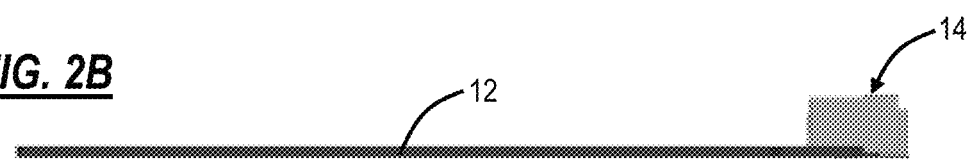
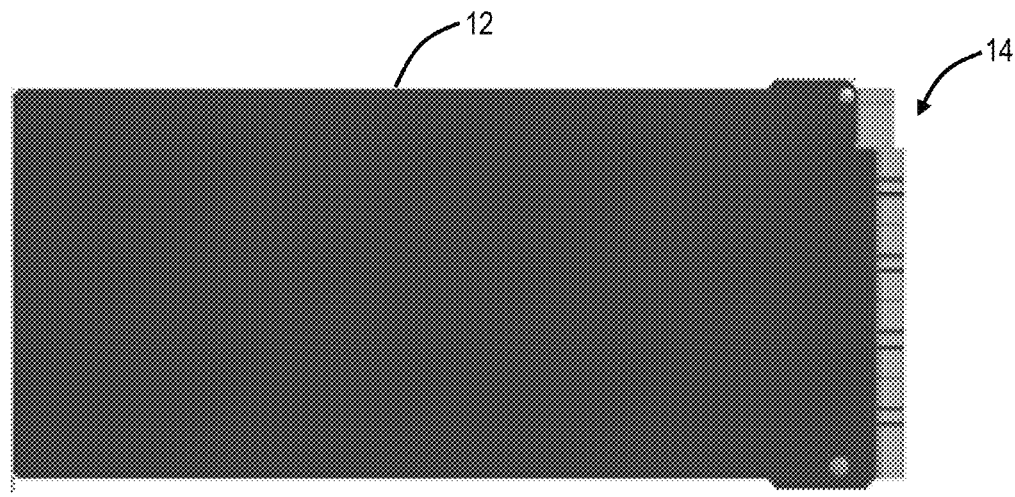
FIG. 2C

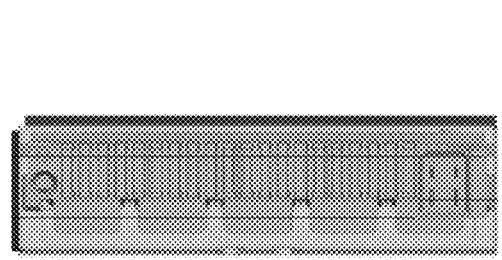
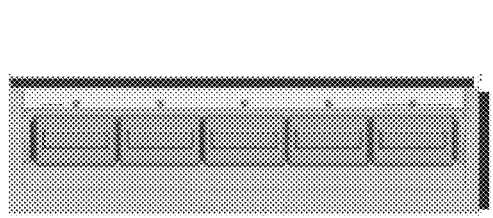
*FIG. 3A*        *FIG. 3B*
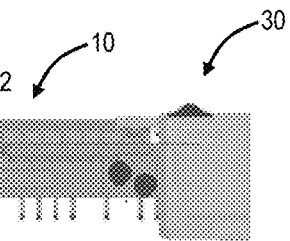
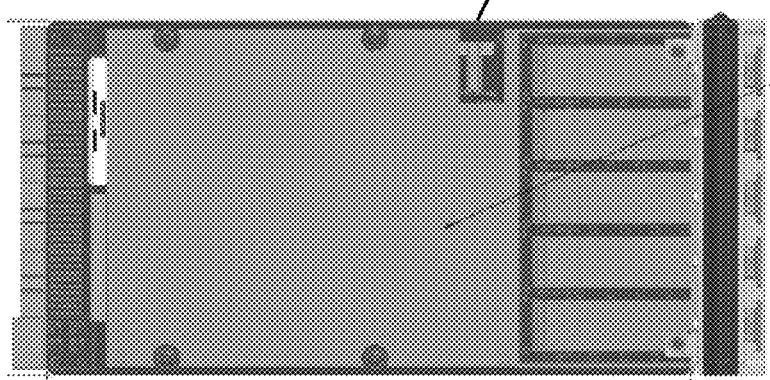
*FIG. 4A*
*FIG. 4B*
*FIG. 4C*

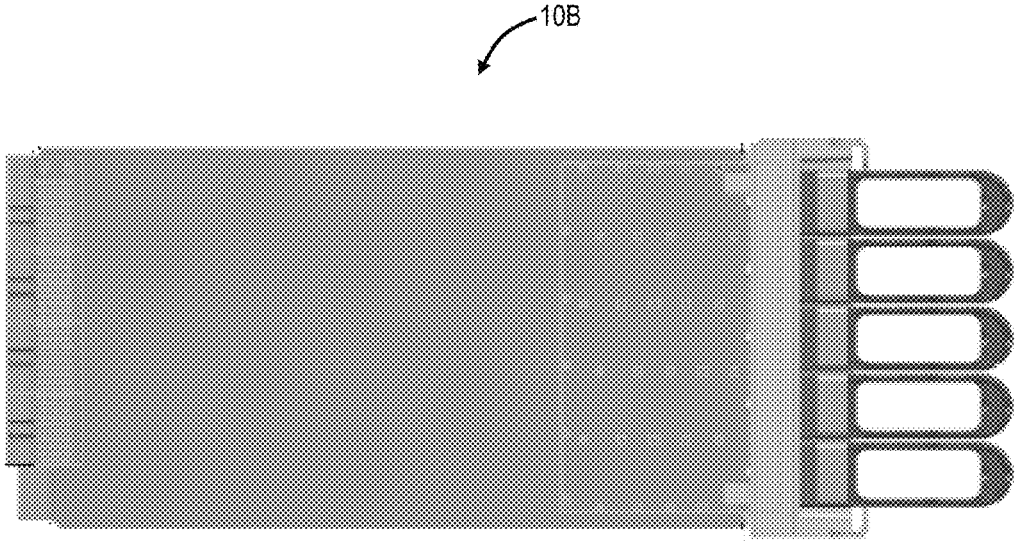
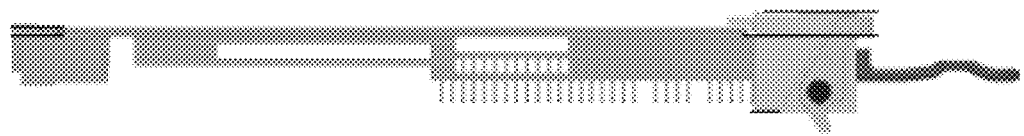
FIG. 11A
FIG. 11B
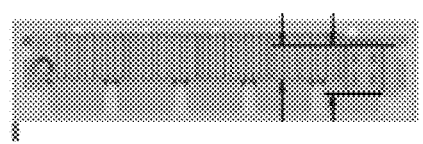
FIG. 11C
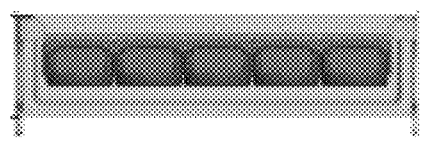
FIG. 11D

UNIVERSAL SUB SLOT ARCHITECTURE FOR NETWORKING MODULES

CROSS-REFERENCE TO RELATED APPLICATIONS

The present disclosure is a continuation-in-part of U.S. patent application Ser. No. 16/391,642, filed Apr. 23, 2019, and which is now U.S. Pat. No. 11,079,559, issued Aug. 3, 2021, the contents of which are incorporated by reference in their entirety.

FIELD OF THE DISCLOSURE

The present disclosure generally relates to networking hardware modules. More particularly, the present disclosure relates to systems and methods for a universal sub slot architecture for networking modules.

BACKGROUND OF THE DISCLOSURE

Networks, data centers, cloud infrastructure, etc. are realized ultimately through physical hardware. The physical hardware is used to realize networking, computing, and/or storage functions including optical/photonic networking, Time Division Multiplexing (TDM), packet switching, etc. Conventionally, there are generally two approaches for how physical hardware is deployed—through a chassis and associated modules or through a rack mounted unit. A chassis-based system includes a chassis with multiple slots and a backplane which support different modules, line cards, circuit packs, blades, etc. (for simplicity, these are referred to as modules). The chassis-based system allows deployment flexibility where modules as-needed or required are selectively inserted in the chassis. The chassis includes an electrical (Printed Circuit Board (PCB)) backplane, fixed-size modules, shared power and cooling for all of the modules, a central switch fabric such as through one or more modules, etc. The rack mounted unit is also referred to as "pizza boxes" and generally include 1-2 (or more) Rack Unit (RU or simply U and which is a standard unit of measurement of 44.5 mm or 1.75") high completely enclosed form factor. The rack mounted unit differs from a chassis in that all of the hardware is already included as the rack mounted unit is deployed. For example, data centers realize network elements such as in a leaf/spine architecture in a completely decentralized and modular form using rack mounted units.

Conventionally, in both these hardware approaches, there is no ability to plug and play at a sub card level, i.e., a module was fixed. Network operators needing different client types and different, evolving line types would need to purchase/utilize multiple individual cards in the chassis or rack-mounted unit. This approach requires excess inventory increasing cost. Further, as described herein, client types and line types refer to optical transceiver types, i.e., optical modems. Optical modem technology is advancing to support higher bit rates, baud rates, Forward Error Correction (FEC), dispersion compensation, etc. The conventional approach requires entirely new modules as new modem technology rolls out. Of course, it would be advantageous from a cost and bandwidth perspective to simply utilize a new modem sub module without requiring an entirely new module.

Additionally, chassis-based systems often require so-called filler modules when an actual module is unequipped (e.g., at initial deployment). The filler modules are required for airflow, Electromagnetic Interference (EMI), etc. Conventional filler modules utilize a connector to a backplane in the chassis with a Printed Circuit Board (PCB) having components that allow the host (chassis) to detect the presence. The presence is important as the lack of a filler card needs to be alarmed. This approach adds cost including the PCB, manufacturing, more complex assembly cost for the connector, manufacturing testing and the need to ship in this very simple card in an anti-static box to protect the component(s) (usually a single resistor) and a single loopback trace on the PCB.

BRIEF SUMMARY OF THE DISCLOSURE

In an embodiment, a network element includes one or more hardware modules each having one or more slots; one or more universal sub slot modules each configured to be inserted in the one or more slots of the one or more hardware modules, wherein each of the one or more universal sub slot modules includes an optics component; a data plane and a control plane communicatively coupled to the optics components; and connectors communicatively coupled to the data plane and the control plane and the connectors are configured to connect to corresponding connectors in the one or more hardware modules. The each of the one or more universal sub slot modules can include a printed circuit board supporting the optics component, the data plane, the control plane, and the connectors, and wherein the one or more hardware modules each include rails in the one or more slots that provide guidance for inserting a corresponding universal sub slot module and stabilization for the corresponding universal sub slot module once inserted. The data plane can include a plurality of lanes each supporting one of 28 Gbps and 56 Gbps such that the one or more universal sub slot modules each support between 800 Gbps and 1.6 Tbps. The one or more universal sub slot modules can be each latched in a corresponding slot of the one or more slots via a latch on a faceplate of a corresponding hardware module. The network element can further include a filler module for each unequipped slot of the one or more slots, wherein the filler module is a passive module without a connector, wherein the one or more hardware modules each include one of i) a Hall Effect Sensor to detect a presence of the filler module based on a magnet thereon and ii) a metal detector to detect a presence of the filler module based on producing an alternating current and detecting a magnetic field produced by the filler module.

A universal sub slot module of the one or more universal sub slot modules can include the optics component as a coherent modem. A universal sub slot module of the one or more universal sub slot modules can include the optics component as 5 Quad Small Form-factor Pluggable (QSFP) interfaces. A universal sub slot module of the one or more universal sub slot modules can include the optics component as 12 Small Form-factor Pluggable (SFP) interfaces. The universal sub slot module can include a plurality of Small Form-factor Pluggable (SFP) interfaces, and wherein the universal sub slot module can include a first printed circuit board having a cage for each of the plurality of SFP interfaces and a second printed circuit board having the connectors, wherein a portion of the first printed circuit board is recessed for a fixed height connector between the first printed circuit board and the second printed circuit board.

In another embodiment, a universal sub slot module is configured to be inserted in a slot in a hardware module that is configured to be inserted in one of a chassis and rack mounted unit. The universal sub slot module includes a printed circuit board; an optics component on the printed circuit board; a data plane and a control plane on the printed circuit board and communicatively coupled to the optics components; and connectors on the printed circuit board and communicatively coupled to the data plane and the control plane, wherein the connectors are configured to connect to corresponding connectors in the one or more hardware modules. The hardware module can include rails in the slot that provides guidance for inserting the universal sub slot module and stabilization for the universal sub slot module once inserted. The data plane can include a plurality of lanes each supporting one of 28 Gbps and 56 Gbps such that the universal sub slot module supports between 800 Gbps and 1.6 Tbps. The universal sub slot module can be latched in the slot via a latch on a faceplate of the hardware module.

The universal sub slot module can further include an Electrically Erasable Programmable Read-Only Memory (EEPROM) having Vital Product Data (VPD) and Runtime Product Data (RPD), wherein the EEPROM is accessible from the hardware module without powering the universal sub slot module. The optics component can be a coherent modem. The optics component can include 5 Quad Small Form-factor Pluggable (QSFP) interfaces. The optics component can include 12 Small Form-factor Pluggable (SFP) interfaces. The universal sub slot module of claim 10, wherein the universal sub slot module can include a plurality of Small Form-factor Pluggable (SFP) interfaces, and wherein the universal sub slot module can further include a first printed circuit board having a cage for each of the plurality of SFP interfaces and a second printed circuit board having the connectors, wherein a portion of the first printed circuit board is recessed for a fixed height connector between the first printed circuit board and the second printed circuit board.

In a further embodiment, a network element includes one or more hardware modules each having one or more slots; one or more universal sub slot modules each configured to be inserted in the one or more slots of the one or more hardware modules, wherein each of the one or more universal sub slot modules includes special function circuitry; a data plane and a control plane communicatively coupled to the special function circuitry; and connectors communicatively coupled to the data plane and the control plane and the connectors are configured to connect to corresponding connectors in the one or more hardware modules. The special function circuitry can perform any of packet processing, packet Operations, Administration, and Maintenance (OAM), Ternary Content-Addressable Memory (TCAM), statistics gathering, and Network Processing Unit (NPU) functionality.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 2A-2C are diagrams of a USS's Printed Circuit Board (PCB) and edge connector.

FIGS. 3A-3B are diagrams of a USS with a faceplate.

FIGS. 4A-4C are diagrams of a USS with maximum component heights on the PCB.

FIGS. 11A-11D are diagrams of a 5×QSFP USS and associated dimensions.

DETAILED DESCRIPTION OF THE DISCLOSURE

The present disclosure relates to systems and methods for a universal sub slot architecture for networking modules. In an aspect, the present disclosure includes a common pluggable sub slot form factor and common interface definition that allows cross-product and cross-platform re-use of various client and line interface types enabling forward and backward compatibility and product introduction velocity. In another aspect, the present disclosure utilizes a magnet or a metal detector for filler module card (or any other type of module) presence detection with no need for a connector, no PCB, no active components, and no anti-static box for transport. This provides an efficient approach to detect the presence of a module via a Hall Effect Sensor (HES) or metal detector while doing so at a low cost. In a further aspect, the present disclosure includes changing the PCB height at certain areas and creating a notch in the PCB to locally change the PCB height thus achieving the required stack up height while using a standard height rigid connector. This includes plated pads on the larger reduced thickness of the PCB to allow the connector to be mounted.

A Universal Sub Slot Module (USSM) host and using USS modules allow network operators to have a lower per-port first in cost by only filling the USSM slots needed (instead of a full card with un-used ports); more effectively full fill a slot's backplane bandwidth by being able to fill the USSM slots with different types of client/line interfaces as needed; introduce new modem technologies allowing high bandwidths and longer links on an existing host module; introduce new pluggable interface types (e.g., QSFP-DD, SFP56, etc.); introduce special function modules that do not include client or line data path interfaces on the USSM faceplate such as Enhanced Packet processing and Packet Operations, Administration, and Maintenance (OAM) modules, Enhanced CPUs, and a common form factor allows many product lines to develop once and introduce many times across product lines again increasing market penetration velocity and acceptance.

Universal Sub Slot Architecture

The Universal Sub Slot (USS) architecture provides a common form factor definition shared between multiple networking, computing, and storage devices. The USS supports current and next-generation interfaces including Legacy Optical Transport Network (OTN), Beyond 100G, Flexible Optical (FlexO), as well as Ethernet Clients and Flexible Ethernet (FlexE) The USS also supports the coherent modems and future modems as well as other special function modules. The USS provides a mechanical form-factor; including a faceplate, rails, and connector specifications. Data plane, control plane, and power supply specifications are provided in terms of a maximum configuration. USS modules should be mechanically and electrically compatible between products. However, functionality may depend on specific host board functions and product feature support.

Figure 1A:
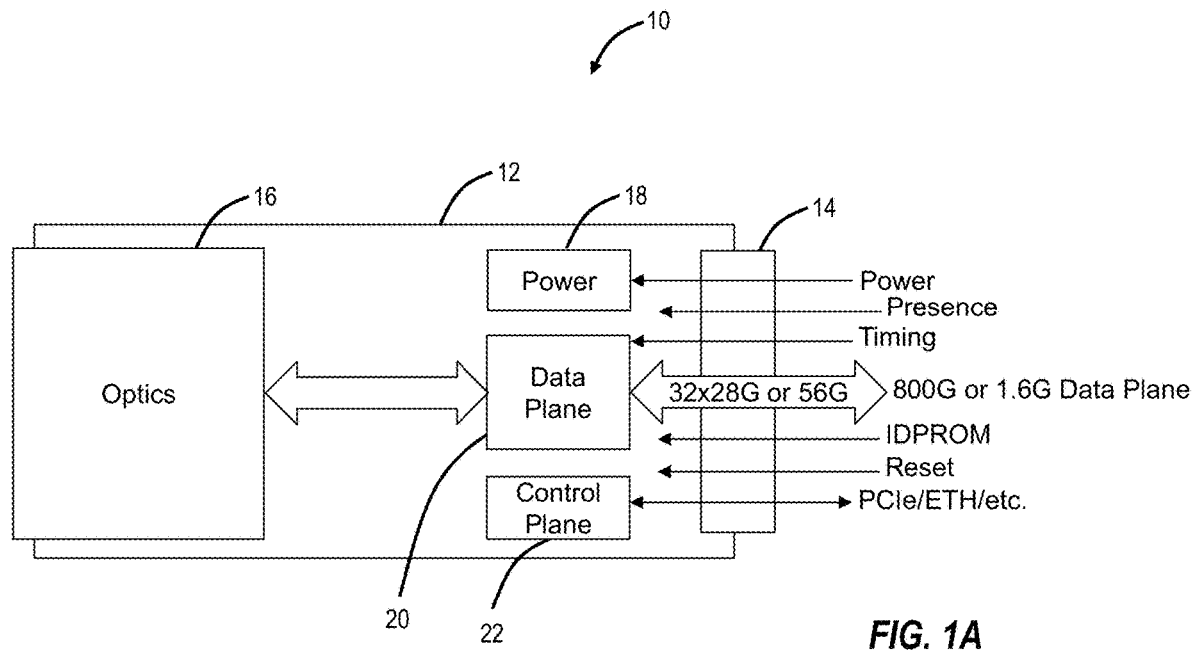
FIG. 1A is a block diagram of the functionality of a Universal Sub Slot (USS) as an optical module.
Figure 1B:
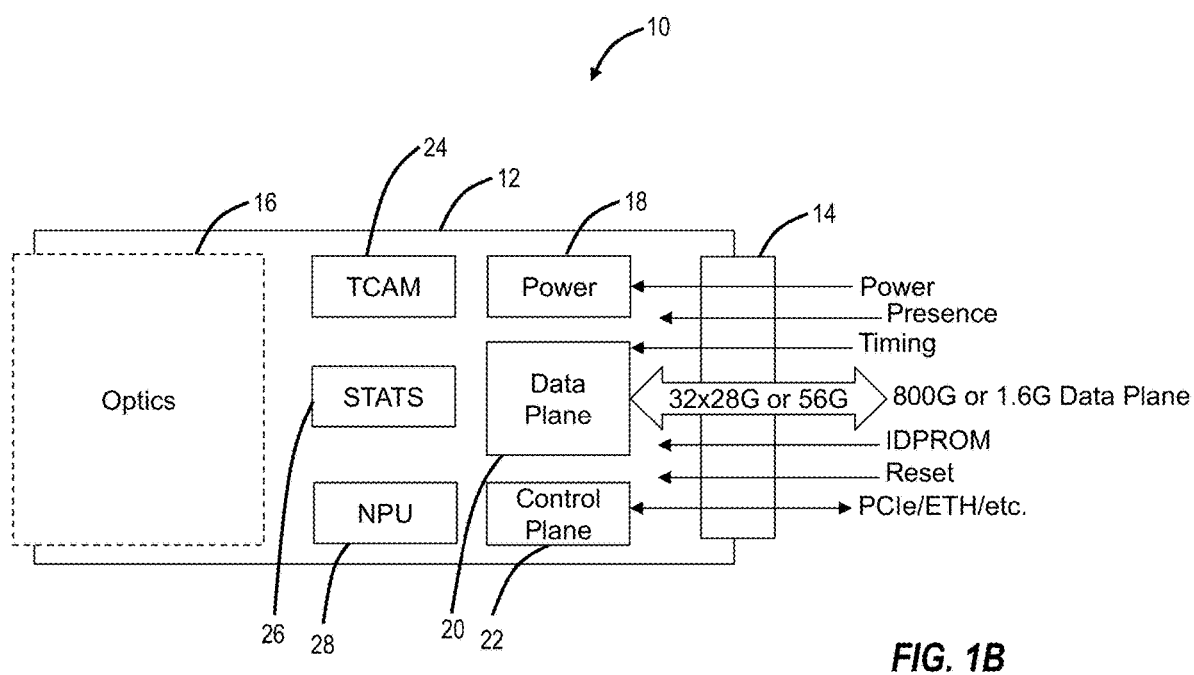
FIG. 1B is a block diagram of the functionality of the USS as a special function module.

FIG. 1A is a block diagram of the functionality of a Universal Sub Slot (USS) 10 as an optical module. FIG. 1B is a block diagram of the functionality of the USS 10 as a special function module. As described herein, the USS 10 is a module that is configured to interface a sub slot in another module (i.e., a host) in a chassis-based or rack mounted unit system. The USS 10 includes a PCB 12 with connectors 14 are one end to plug into a module and optics 16 at the other end on a faceplate. In between the optics 16 and the connectors 14 are circuitry including power 18, a data plane 20, and a control plane 22. The USS 10 includes specifications for mechanical constraints, the power supply 18, and certain control plane 22 functions. However, the data plane 20 including the optics 16, and other control plane 22 functions can be optionally utilized by the product integration. These specifications ensure the USS 10 can be used across multiple platforms.

In an embodiment, the USS 10 can include special function circuitry, such as, for example, for packet processing, packet OAM, etc. The USS 10 can include a Ternary Content-Addressable Memory (TCAM) 24, a statistic (STATS) gathering engine 26, a Network Processing Unit (NPU) 28, etc. The optics 16 may be optional with the special function circuitry.

In an embodiment, the USS 10 measures 4.2" wide and 10" in length including the faceplate and the connectors 14. The maximum height can be restricted by the faceplate clearance and mechanical considerations to 1.1" (28 mm). The component height including heat sinks on the primary side of the PCB 12 limited to 0.8" (21.15 mm). The data plane can support up to 800 Gbps in with current generation technology with 28 Gbps data plane lanes, and up to 1.6 Tbps in the next generation utilizing 56 Gbps lanes. A timing plane between the host and the USS 10 can support OTN reference clocks, as well as Ethernet Precision Time Protocol (PTP) clocks. A line reference clock can be available from the USS 10 to the host, and additional undefined clocks are available. Optional support for protocol clocks are provided for each management protocol. Examples in the timing plane include Reference Clock Host to USS 10, Time of Day (TOD) Clock Host to USS 10, Line Reference Clock USS 10 to Host, Performance Monitoring (PM) Tick Host to USS 10, Protocol Clocks (e.g., PCIe, SFI, etc.), etc.

The control plane 22 provides interfaces for many common protocols to support various USS 10 configurations. These include Peripheral Component Interconnect Express (PCIe), Ethernet (Serial Gigabit Media Independent Interface (SGMII)), SerDes Framer Interface (SFI), Inter-Integrated Circuit (I2C), Universal Asynchronous Receiver/Transmitter (UART), Field Programmable Gate Array (FPGA) Serial Configuration lines, etc. Use of management protocols is optional depending on the USS 10 configuration. In addition, every active USS 10 can include a presence line, a reset line, identification line (IDPROM), and access to three reset lines.

The USS 10 can require a 12V power supply and supports various amounts of power such as up to 130 W, up to 300 W, etc. PM Bus power control is available to control and monitor the power system on the USS 10. In addition to the service providing USS 10, a filler or blank USS definition is provided. The filler USS is passive and does not contain a USS to host connector. However, the presence can be detected by the host using a Hall Effect Sensor (HES).

The data plane 20 can include 32 high-speed links supporting 28 Gbps or 56 Gbps each. These links are intended to support a USS 10 up to 1.6 Tbps. The USS 10 definition allows for simple data plane 20 including traces between the connector 14 and the optics 16 to complex providing onboard framing and multiplexing. The data plane 20 design drives the control and timing plane complexity.

The control plane provides optional support for various management protocols. Use of the protocols are not required and may not be supported by a USS 10 module. If a protocol is used, the protocol clock must also be provided to the USS 10. The USS 10 can utilize PCI version 2 interface supporting up to 5 Gbps, provide two Ethernet interfaces over SGMII, etc. The PCIe interface cam ne over differential pair pins and could run as fast as 56 Gbps although there is no definition of PCIe at that rate (the current version 5 support 32 Gbps). Two I2C interfaces can be provided by the USS 10 to support 100 kHz and 400 kHz modes depending on the clock provided by the host. The host is assumed to be the master and all devices on the USS 10 should be a slave. It is assumed, although not required, that the I2C interfaces will utilize an I2C Switch on the USS before branching out to multiple slave devices either through an I2C switch or I/O expander. The USS 10 can support a Serial Peripheral Interface (SPI) 4-wire interface with two chip select lines. The configuration allows for two independent slaves. The USS 10 can support both Intel and Xilinx FPGA Serial Configuration. Common pins on the USS Connector 14 are identified to support both FPGA types. The Config, Config Status, and Config Done lines can be provided over the I2C interface, and not directly over the connector 14.

An Identification Electrically Erasable Programmable Read-Only Memory (EEPROM) can provide a 1-wire 512-byte EPROM on the USS 10 to allow the host to identify the USS 10 installed in the host, and retrieve pertinent information related to inventory, manufacturing, software, etc. The information stored in the ID EEPROM can be in JavaScript Object Notation (JSON) format. The EEPROM is readable from the host board and can be accessed even when the USS 10 is not powered. The EEPROM contents are formatted using JSON. The device is a 16×32-byte per page device and is broken into 2 parts; Vital Product Data (VPD) and Runtime Product Data (RPD). The USS Filler module does not have an EPROM.

The following table provides an example of the VPD in the ID EEPROM. The Manu column stands for manufacturing where this field is updated in manufacturing on a per serial number basis.

| Field | Description | Example Value | Size (bytes) | Manu | Access |
|---|---|---|---|---|---|
| VER | Version of the data structure | 01 | 2 | No | RO |
| Type | String describing the USS | 12xSFP+ | 20 | No | RO |
| HWID | Hardware (H/W) ID | 0x00005001 | 10 | No | RO |
| IN | ID number | 174-0514-900 | 12 | No | RO |
| HWRel | H/W Release | 001 | 3 | Yes | RO |
| SWRel | Software (S/W) Release | 001 | 6 | No | RO |
| SER | Serial Number | C23456789012 | 12 | Yes | RO |
| CLEI | Common Language ID (CLEI) code | WM2IHYJBAA | 10 | No | RO |
| MANU | Manufacturing site | 123 | 6 | Yes | RO |
| YR | Manufacturing year | 2019 | 4 | Yes | RO |
| WK | Manufacturing week | 52 | 2 | Yes | RO |
| PWR | Maximum power of this unit (Watts) | 100 | 3 | No | RO |
| SA | Subassembly ID | 174-0514-810 | 12 | Yes | RO |
| SARel | Subassembly ID H/W Release | 001 | 3 | Yes | RO |
| CNT | Count the number VPD updates | 200000 | 6 | No | RO |
| CRC | VPD of CRC. ITU CRC16 | 0x1111 | 6 | No | RO |

The following table provides an example of the RPD.

| Field | Description | Example Value | Size (bytes) | Manu | Access |
|---|---|---|---|---|---|
| VER | Version of this data structure | 01 | 2 | No | RO |
| AGE | Age (beginning of life) in minutes | 0x000000 | 10 | No | RW |
| INS | Insertion count (# of times inserted in host) | 1 | 3 | No | RW |
| HOST | Serial number of last mated host | S23456789 | 12 | No | RW |
| CNT | Count the number of RPD updates | 2000000 | 6 | No | RW |
| CRC | RPD of CRC | 0x22222 | 6 | No | RW |

In an embodiment, the updates (Read/Write) of the RPD data are performed, on start, at 1 min, 2 min, 5 min, 20 min, 1 hour and then finally 1 per day periodically going forward. This approach of quick updates at the beginning to slower updates over time is to reduce the wear on the EEPROM as a balance to capture quick data where there are Out-of-Box (OOB) failures versus long term wear on the EEPROM.

The USS 10 provides 2 reset lines allowing the host to cold reset the USS 10 module. The cold reset implies a full reset of all components on the USS 10 module, including the reloading of all field programmable logic. A cold reset shall include all components of the USS 10 module except for the reset status register and reset control logic. It shall initialize all registers to place the module in a state where all outputs are in an inactive or initial state. The second cold reset line is intended to support a second stand-alone modem on the USS 10 module.

The USS 10 may support a warm reset through the control interfaces, such as I2C. The warm reset affects only components not directly associated with the data plane and may affect communication with the module for a brief period. A warm reset of the USS 10 shall not affect the data plane 20. The warm reset function is optional and may not be required on all modules depending on the architecture. The reset lines shall be operated by the host providing a pull-up to 1.8V.

The USS 10 can support a maximum power of up to 300 W delivered by 9 regulated 12V lines. The host shall determine when power should be applied to the USS 10 module. The USS 10 module shall not require specific power sequencing from the host. If power sequencing is required, it shall be handled by the USS 10 module. The host may choose to not provide power to a USS 10 module or depower a module. Some reasons for limiting power to a USS 10 module include hardware fault conditions, high-temperature conditions, or overpower conditions.

The USS slot power connector 14 can have longer pins than the digital signal connector pins. On insertion, the power pins will mate before the digital signal pins. On removal, the digital signal pins will disconnect before the power pins. Soft start circuits shall be provided on the Host, not on the USS 10 modules.

On USS 10 module insertion, prior to detecting the USS 10 presence, a host soft start circuit is in a power-down state, the USS slot power pins will mate first then the digital signal pins mate, and once presence is detected, after the power pins are mated, the host soft start circuit will power up the USS 10. On USS 10 module removal, a presence pin, a shorter digital signal connector, will be disconnected before the power/ground (GND) pins. The host will disable the USS 10. The soft start circuit on the host will shut off the power to the USS 10. This will allow power shut-off before the USS slot power pins are disconnected. "Smart" USS 10 modules will detect 12V voltage failure and will immediately begin shutdown procedures as needed before full discharge (e.g., file system shutdown).

The USS 10 includes support for various reference clocks associated with the data plane 20 and control plane 22 protocols. Specifically, the host data plane reference clock and IEEE 1588 PTP clocks are defined. Clocks for the supported control plane protocols are also required.

| Clock | Rate |
|---|---|
| Line Reference Host to USS | 78 MHz, 125 MHz |
| Line Reference USS to Host | 8 KHz |
| PTP Time of Day | 125 MHz |
| Time of Day | 1 Hz |
| PM Tick | 1 Hz |
| PCIe | 100 MHz |
| SPI | 25 MHz |
| I2C | 100 KHz/400 KHz |
| FPGA Serial Configuration | 60 MHz |
| PM Bus | 100 KHz/400 KHz |

Mechanical

FIGS. 2A-2C are diagrams of the USS 10 and the PCB 12 illustrating various dimensions. FIGS. 3A-3B are diagrams of the USS 10 with faceplate 30 dimensions. FIGS. 4A-4C are diagrams of the USS 10 with maximum component heights on the PCB 12. The PCB 12 can include a primary side with circuitry and a heat sink 32 and a secondary side. The primary side supports higher components than the secondary side.

Figure 5:
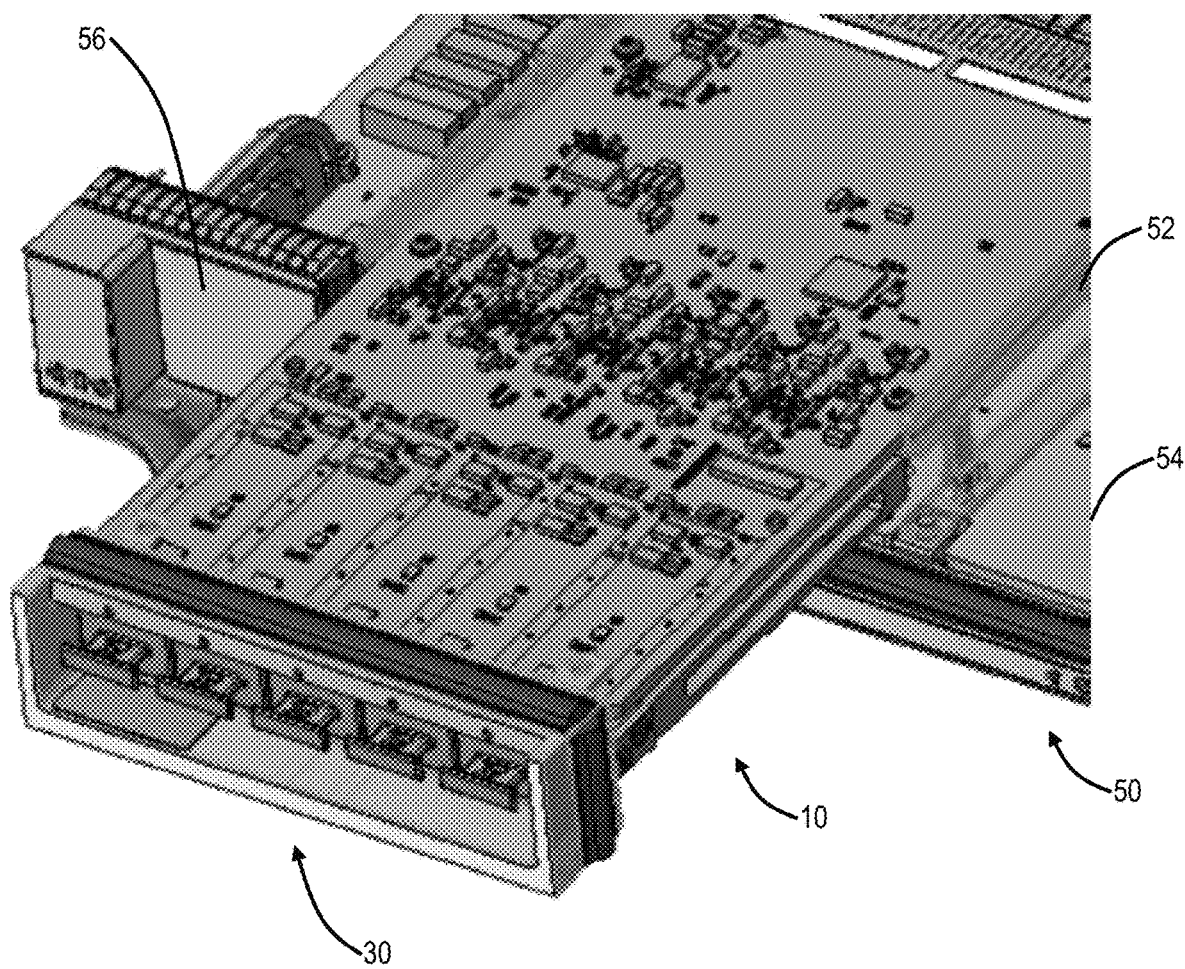
FIG. 5 is a perspective diagram of a USS being inserted into a host module.

FIG. 5 is a perspective diagram of the USS 10 being inserted into a host module 50. The host module 50 is configured for insertion into a chassis of a network element. The USS 10 is a sub slot module that is configured for insertion into the host module 50. The host module 50 includes rails 52 along which the USS 10 PCB 12 edge runs. The rails 52 are physically disposed on a PCB 54 on the host module 50. The rails 52 provide both insertion guides and stabilization for the USS 10.

The faceplate 30 is attached to the PCB 12 and intended to fit into an opening in a host faceplate 56. The host faceplate 56 and USS 10 faceplate 30 when seated should form a sufficient EMI barrier to meet Network Equipment-Building System (NEBS) specifications. The USS 10 can include two removal/insertion locking latches on the host faceplate 56.

Figure 6:
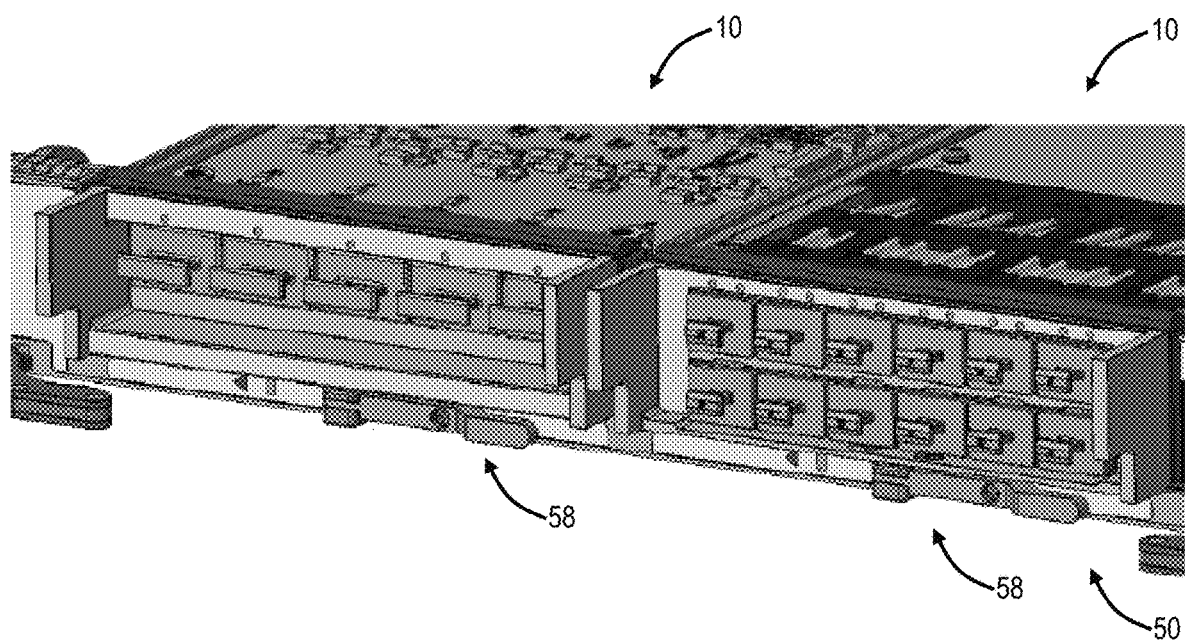
FIG. 6 is a diagram of two USS modules in a host module illustrating two removal/insertion locking latches on the host faceplate.
Figure 7:
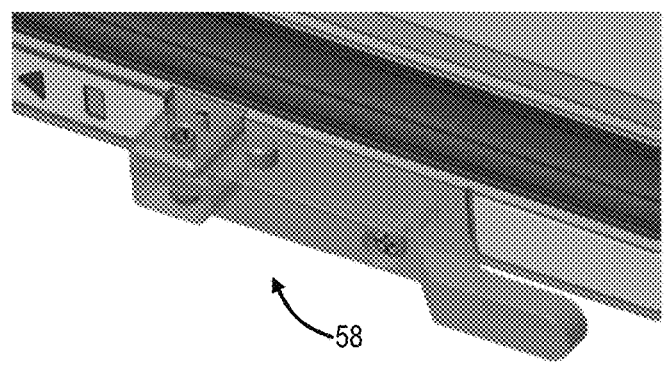
FIG. 7 is a diagram of a close-up view of the removal/insertion locking latch.

FIG. 6 is a diagram of two USS 10 modules in the host module 50 illustrating two removal/insertion locking latches 58 on the host faceplate 56. FIG. 7 is a diagram of a close-up view of the removal/insertion locking latch 58. An example of the removal/insertion locking latches 58 is described in U.S. patent application Ser. No. 16/140,609, filed Sep. 25, 2018, and entitled "Compliant micro latch for high-speed signal sub-slot pluggable modules," the contents of which are incorporated by reference herein.

Thermal

The USS 10 allows for horizontal, front-to-back (x-axis) or vertical, side-to-side (y-axis) airflow across the USS 10 module. For horizontal airflow, the faceplate 30 should have sufficient inlets to allow cooling of the USS 10 module. The host module 50 should not be required to support USS 10 modules with airflow other than that for which it is intended. An unused sub-slot in a host module 50 shall be required to have a filler module installed. Failure to install a filler module in a sub-slot should prompt a notification/alarm on the host system and/or the host module 50. The host system may take action on other USS 10 modules on the host module 50 due to a missing filler module; this action may include powering down other USS slots on the host module 50.

Connectors

In an embodiment, the USS 10 connector 14 is the ExaMAX from Amphenol. The connector 14 can have 80 differential pairs and 40 single ended pins. The differential pairs are rated up to 56 Gbps allowing for forward compatibility and future generation USS 10 modules. Connector keying shall be used to ensure correct airflow orientation USS modules are installed into the host. Two types of USS keys shall be provided, namely Horizontal Airflow—i.e., front-to-back, and Vertical Airflow—i.e., side-to-side.

LED

The host can provide at least a tri-color USS 10 status Light Emitting Diode (LED) on the faceplate 56. The LED should be controllable from the host to facilitate consistent functionality with the host system. At a minimum, the host LED shall indicate a working or failed state of the USS 10 module. The default state of the slot LED shall be disabled. The USS 10 module shall provide a tri-color status LED per port on the faceplate 30. The LED should be controllable from the host to facilitate consistent functionality with the host system. The default state of the port LED(s) shall be disabled.

Filler Module

Figure 8:
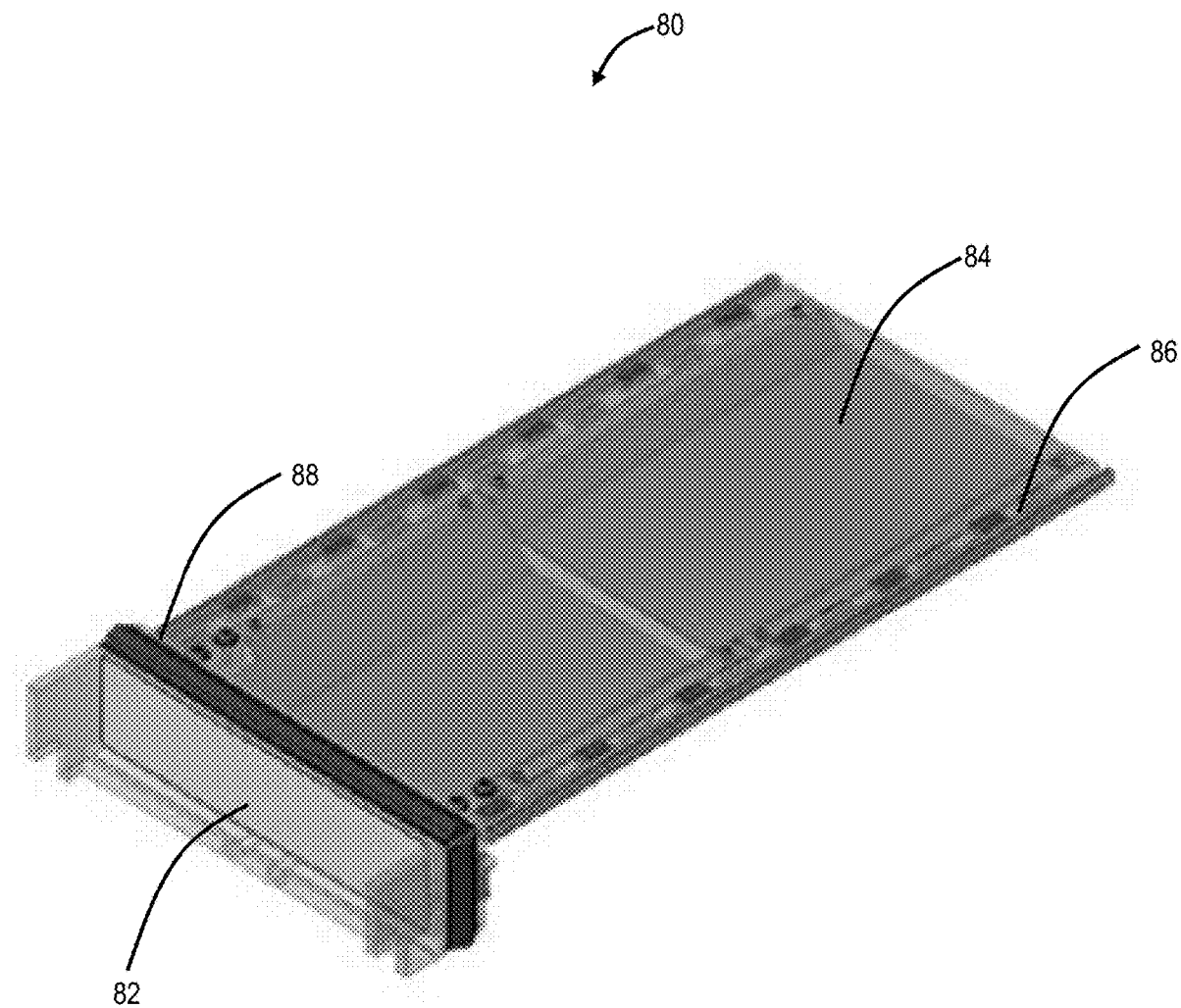
FIG. 8 is a diagram of a USS filler module.

FIG. 8 is a diagram of a filler module 80. The filler module 80 is a generic or blank module that is installed in the host module 50 when no USS 10 module is inserted. The filler module 80 includes a faceplate 82 and a plastic card 84 with rails 86 in place of the PCB with air baffles to restrict airflow. No connector, and thus no power or control plane is provided.

Of note, the filler module 80 does not include the connectors 14 or an EEPROM for identification. However, the filler module 80 is a detectable passive filler card. Specifically, the filler module 80 can include a magnet 88, in conjunction with a Hall Effect Sensor on the host module to detect the filler module 80 presence. In the proposed embodiment, the magnet 88 is used to create a magnetic field that the host module's 50 HES detects.

In another embodiment, there is no magnet 88 saving cost and simplifying mechanical attachment. Detection is accomplished by implementing a metal detector on the host module 50. The metal detector on the host module 50 operates by having an oscillator drive an alternating current that passes through a PCB coil thus producing an alternating magnetic field. When the filler module 80 comes close to the host coil, eddy currents will be induced in the filler module's 80 metal, and this produces a magnetic field of its own. If another coil on the host module 50 is used to measure the magnetic field (acting as a magnetometer), the change in the magnetic field due to the filler module's 80 metallic object can be detected.

In a further embodiment, a frequency code is provided in the emitted magnetic field with the host module's 50 serial number to prevent false triggering due to other alternating magnetic fields produced by adjacent host modules 50. Also, since the host module 50 is generating an alternating magnetic field, the induced currents in the filler module 80 can be harvested to drive lower-power circuitry (as is done with Radio Frequency Identification (RFID)) for the purpose of gathering information about the filler module 80. In particular, the filler modules 80 can have various airflow impedances to match the airflow impedance of the other cards in a system. So, it can be useful to confirm that the correct impedance filler card is inserted.

These module detection techniques can be used beyond filler module 80 detection. For example, the host module 50 could use these techniques to detect the presence of a connector's metallic latch. This would avoid the finicky product problems with card latches actuating push-button switches and the tight tolerances this requires. In these smaller applications form factors, it can be advantageous to avoid the need for a magnet.

The use of a magnet or a metal detector allows module presence detection with no need for a connector, no PCB, no active components, and no anti-static box. This provides a simple approach to have the ability to detect the presence of the card via the HES or metal detector while doing so at a very low cost.

Example USS

Figure 9:
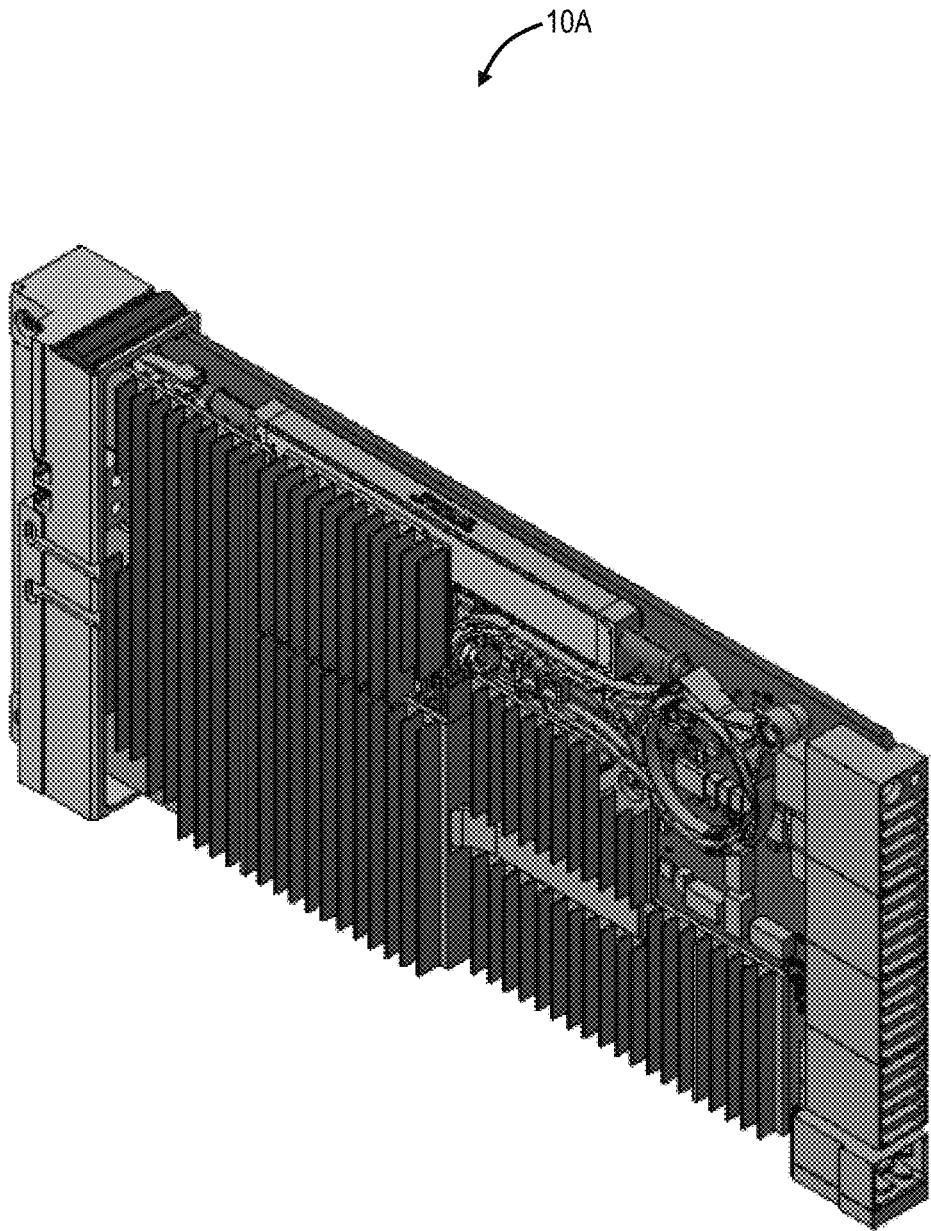
FIG. 9 is a diagram of a USS that is a single coherent modem.

FIG. 9 is a diagram of a USS 10A that is a single coherent modem. For example, the USS 10A can support the optics 16 having 400 Gbps to 800 Gbps and future bandwidth up to 1.6 Tbps.

Figure 10:
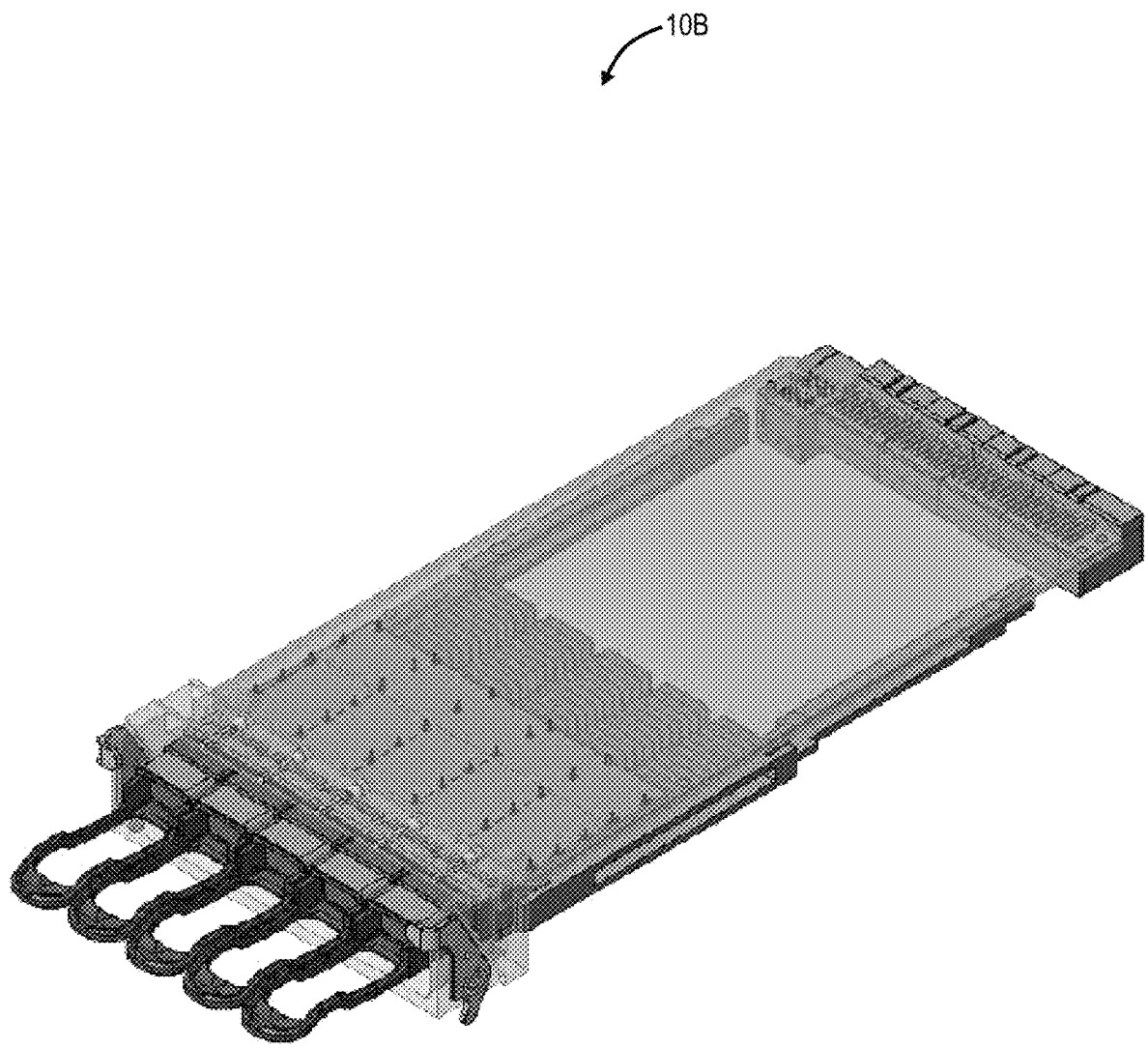
FIG. 10 is a diagram of a USS that has 5×Quad Small Form-factor Pluggable (QSFP) interfaces.

FIG. 10 is a diagram of a USS 10B that has 5×Quad Small Form-factor Pluggable (QSFP) interfaces. FIGS. 11A-11D are diagrams of the USS 10B and associated dimensions. The 5×QSFP USS 10B can exist in two forms; the first support QSFP optics, timing, and control plane without a data plane framer/multiplexer, and the second provides a framer/multiplexer onboard. The QSFP can be any variant of QSFP include QSFP, QSFP+, QSFP14, QSFP28, etc.

Figures 12A, 12B:
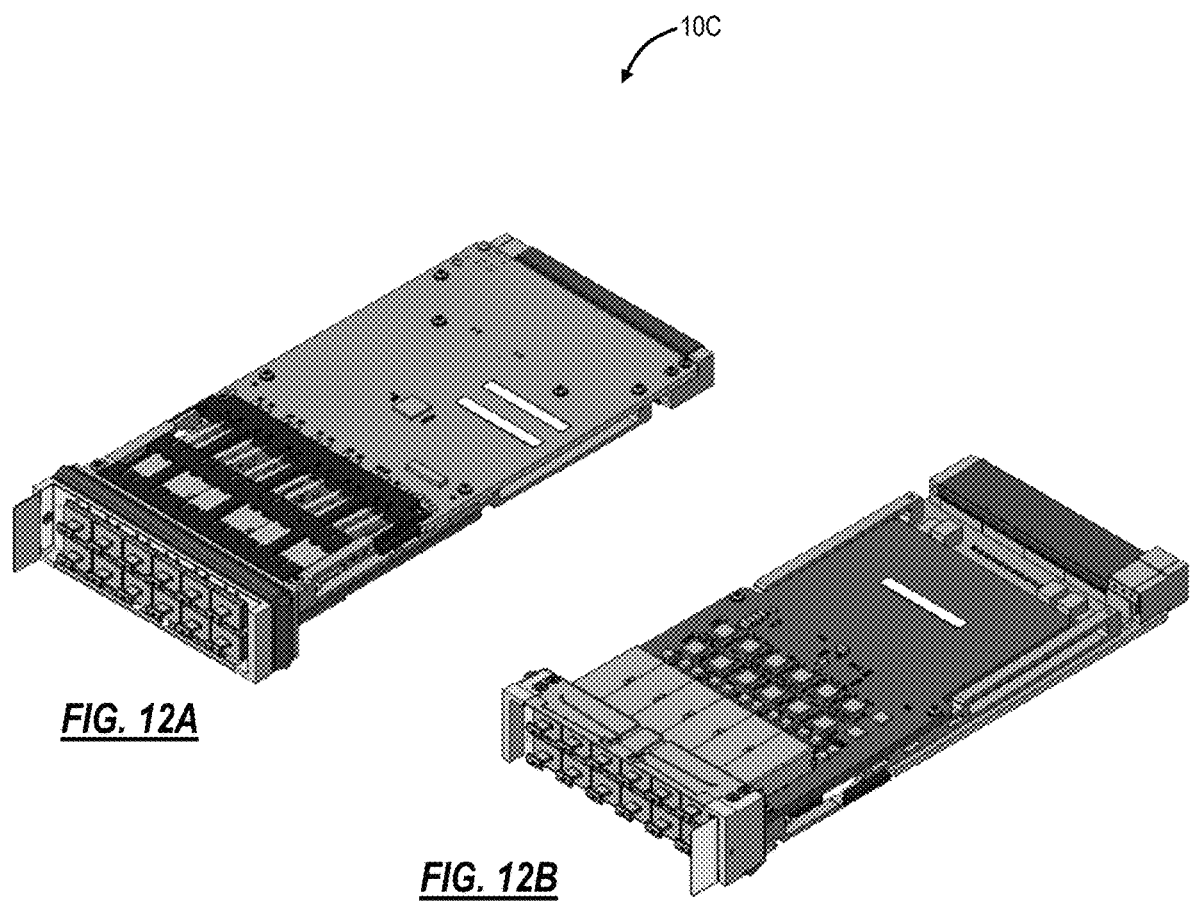
FIGS. 12A-B are diagrams of a USS 10C that has 12×Small Form-factor Pluggable (SFP) interfaces.

FIGS. 12A-1B are diagrams of a USS 10C that has 12×Small Form-factor Pluggable (SFP) interfaces. The 12×SFP USS 10C provides 12 1 Gbps, 10 Gbps, and/or 25 Gbps interfaces. The 12×SFP USS 10C supports SFP optics, timing, and control plane without a data plane framer/multiplexer.

PCB Notch to Manage Height and Alignment to Accommodate Fixed Height Connectors

Figure 13:
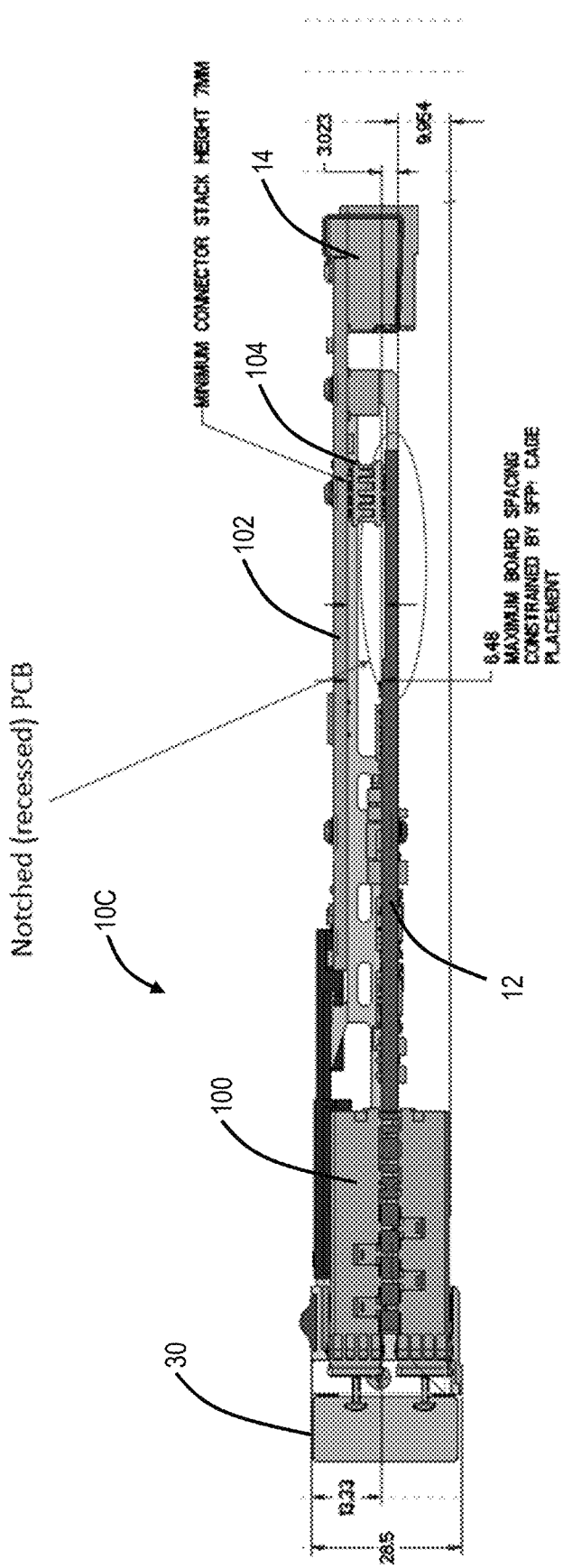
FIG. 13 is a side diagram of the USS that has 12×Small Form-factor Pluggable (SFP) interfaces.

FIG. 13 is a side diagram of the USS 10C that has 12×Small Form-factor Pluggable (SFP) interfaces. The USS 10C includes two rows of 6 SFP interfaces on the faceplate 30. Here, the PCB 12 that includes the SFP+ cages 100 has a fixed thickness specified by the cage vendor for belly-to-belly mounting. The PCB 12 placement is then fixed by the USS faceplate 30 space. A second PCB 102 in the assembly has a fixed position with the second PCB 102 located on the motherboard and used to provide interconnect from the PCB 12 to the connectors 14 via a fixed height connector 104. The spacing between the first PCB 12 and the second PCB 102 is now an odd number that cannot be used for the fixed height connector 104.

In an embodiment, PCB material is removed to reduce the PCB 12 thickness where a PCB interconnect rigid connector 104 is placed to ensure the overall height of the combined two PCBs 12, 102 fits in the required space. The thickness change made on the first PCB 12 keeps the cage portion at the front of the card at 3 mm, (required by the cage vendor) and changing the thickness at the back of the PCB 12 to meet a standard connector 104 height.

That is, in the USS 10C, there are specific sizing and backplane interconnection alignment requirements as well as faceplate alignment requirements. To be able to support faceplate alignment with the SFP+ cages 100 as well as support the required USSM backplane connector alignment into the host module 50, there is a requirement for two PCBs 12, 102 (the front PCB 12 with the cages 100 and the rear PCB 102 with the backplane connector 14). There is also a need to find a cost-effective interconnection between these two PCBs 12, 102 while using standard off the shelf connectors that have only a few fixed heights to choose from.

The present disclosure reduces the PCB 12 height only in the area of the connector 104 to allow for correct alignment at the faceplate 30 and the backplane connectors 14 while using an off the shelf connector 104. This could also be used for other purposes to manage height restrictions for devices, tall capacitors, power supplies, heatsinks for example and creating pockets in PCBs 12, 102 where needed.

Network Element

Figure 14:
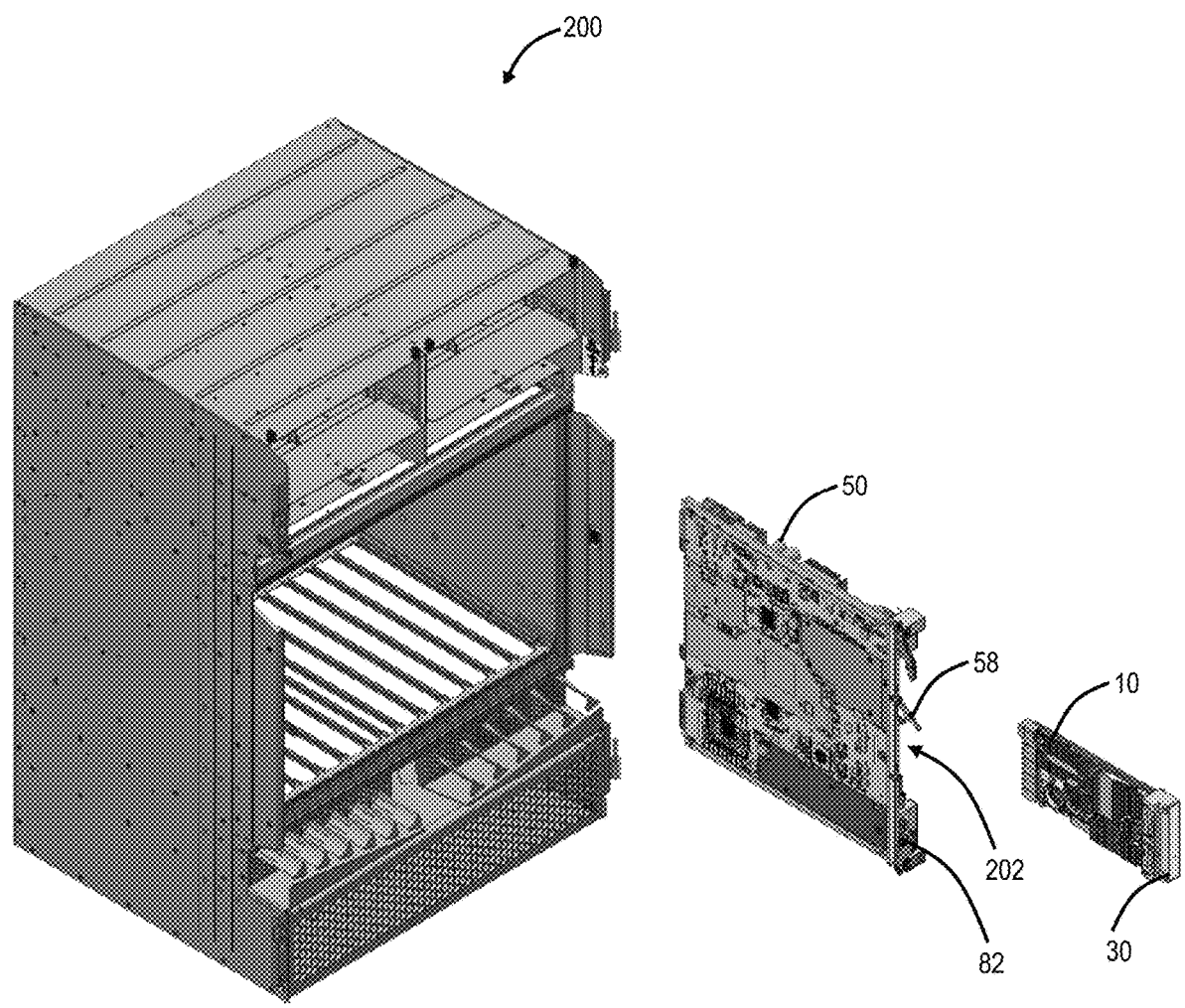
FIG. 14 is a perspective diagram of a network element with an example hardware module and USS module.

FIG. 14 is a perspective diagram of a network element 200 with an example hardware module 50 and USS 10 module. Again, the network element 200 can form a network device such as a router, switch, cross-connect, Wavelength Division Multiplexing (WDM) terminal, etc. The hardware module 50 can be a line card, switch card, etc. The hardware module 50 is configured to insert into the network element 200. Note, the example of FIG. 14 is a chassis-based system, but those skilled in the art will appreciate the hardware module 50 can also be configured in a rack mounted system such as where the hardware module 50 is fixed.

The USS 10 module is configured to insert into the hardware module 50. The hardware module 50 includes one or more slots 202 for receiving one or more USS 10 modules and a latch 58 for each of the one or more slots 202. The USS 10 modules have a faceplate 30 without a latch. The latch 58 is configured to lock the corresponding USS 10 module with compliant force. The latch 58 is small and uses minimal faceplate 82 real estate.

Router Universal Sub-Slot Module (USSM)

In another embodiment, the present disclosure includes a USS 10 module for use in a router, referred to as a USS host. The WR-USS host and using WR-USS modules allow:

a customer to have a lower per port first in cost by only filling the USSM slots needed (instead of a full card with un-used ports), a customer to more effectively full fill a slots backplane bandwidth by being able to fill the USSM slots with different types of client/line interfaces as needed, a customer to introduce new modem technologies allowing high bandwidths and longer links on an existing host card. This also allow vendors to introduce new modems sooner into the market, a common form factor allows many product lines to develop once and introduce many times across product lines again increasing market penetration velocity and acceptance, and support for backplane rates up to 112G between the WR-USS and the host board using a cabled backplane.

The present disclosure includes a 112G ready common pluggable Sub Slot form factor style implementation and common interface definition that allows cross-product and cross platform re-use of various client and line interface types enabling forward and backward compatibility and product introduction velocity. The router USS 10 is intended to support current and next generation interfaces including Legacy OTN, Beyond 100G, FlexO, CEM, as well as Ethernet Clients and FlexE. The router USS 10 also supports coherent optical modems.

The router USS 10 provides a mechanical form-factor; including face plate, rails, and connector specifications. Data plane, control plane, and power supply specifications are provided in terms of a maximum configuration. Router USS 10 modules compliant to this definition are mechanically and electrically compatible between products. However, functionality may depend on specific host board functions and product feature support.

Figure 15:
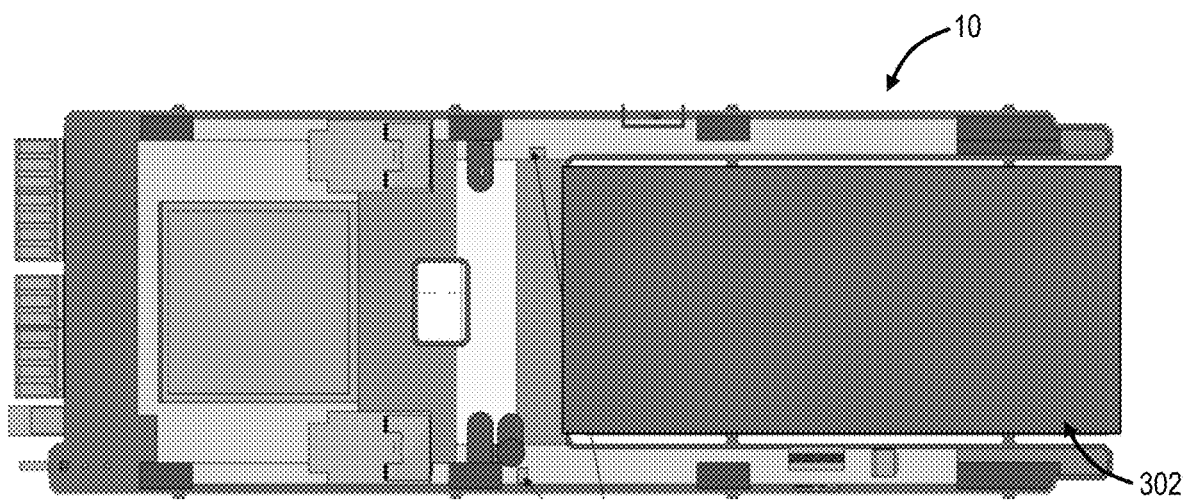
FIG. 15 is a diagram of a top view of a router USS.
Figure 16:
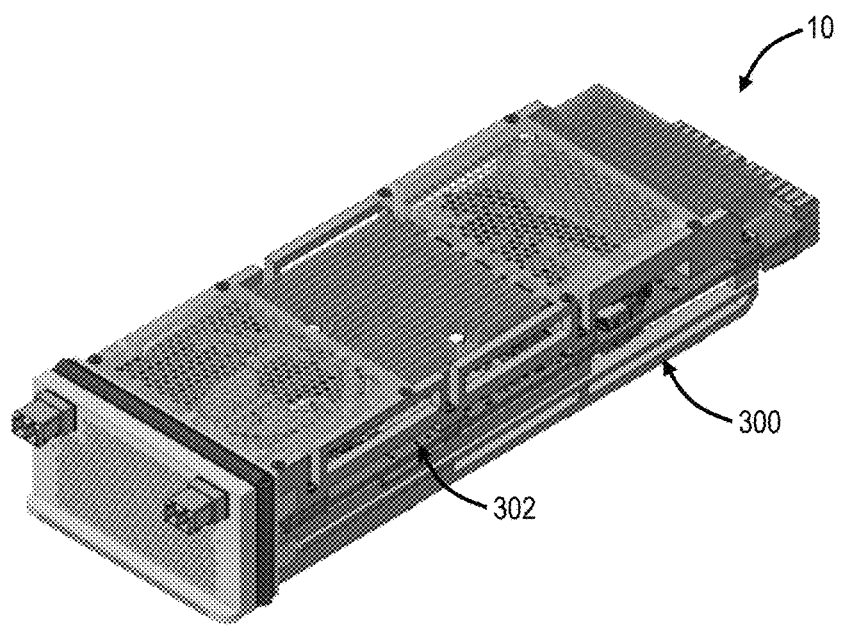
FIG. 16 is a perspective diagram of the router USS.

FIG. 15 is a diagram of a top view of the router USS 10. FIG. 16 is a perspective diagram of the router USS 10. In an embodiment, the router USS 10 measures approximately 4.2" wide and 12" in length including faceplate and connector. The maximum height can be restricted by the faceplate clearance and mechanical considerations to 1.75".

The data plane can support up to 1.6 Tb in the one embodiment with 56 Gbps data plane lanes, and up to 3.2 Tb in another embodiment utilizing 112 Gbps lanes.

The timing plane supports Freerun, OTN reference clocks, as well as Ethernet PTP clocks. A line reference clock is available from the router USS 10 to the host, and additional undefined clocks are available. Optional support for protocol clocks are provided for each management protocol.

The control plane provides interfaces for many common protocols to support various WR-USS configurations. These include PCIe, Ethernet (QSGMII, 1000BASE-T and XFI), QSPI, I2C, UART, and FPGA Serial or Parallel Configuration lines. Use of management protocols is envisioned router USS 10 configurations. In addition, every active router USS 10 includes a presence line, identification line (ID EEPROM), and access to three reset lines.

The router USS 10 can require a 12V power supply and supports up to nominal 35A (420 W). PM Bus power control is available to monitor the power system on the WR-USS.

In addition to, the service providing router USS 10, a filler or blank USS definition is provided. The filler USS is passive, and does not contain a USS to host connector. However, presence can be detected by the host using a Hall Effect Sensor.

The host board includes rails along which a board edge 300 runs. The rails provide both insertion guides, and stabilization for the router USS 10. The USS 10 face plate is attached to a USS PCB 302, and intended to fit into an opening in the host face plate. The host face plate and the USS face plate when seated should form a sufficient EMI barrier to meet NEBS specifications. The host includes a removal/insertion locking latch on the face plate below the USS slot.

PCB-Less Cable Based High-Speed Interconnections with Mounted Cabled Connectors

The USS 10 is a Field Replaceable Unit (FRU) that is meant to be added/removed in the field. The USS 10 can connect to standard connectors such as where the FRU plugs into a mezzanine PCB and the mezzanine PCB plugs into a motherboard PCB. The drawbacks of this approach include real estate space (connectors need more space) and it impacts signal integrity which is very important for a 112G data path signal.

Figure 17:
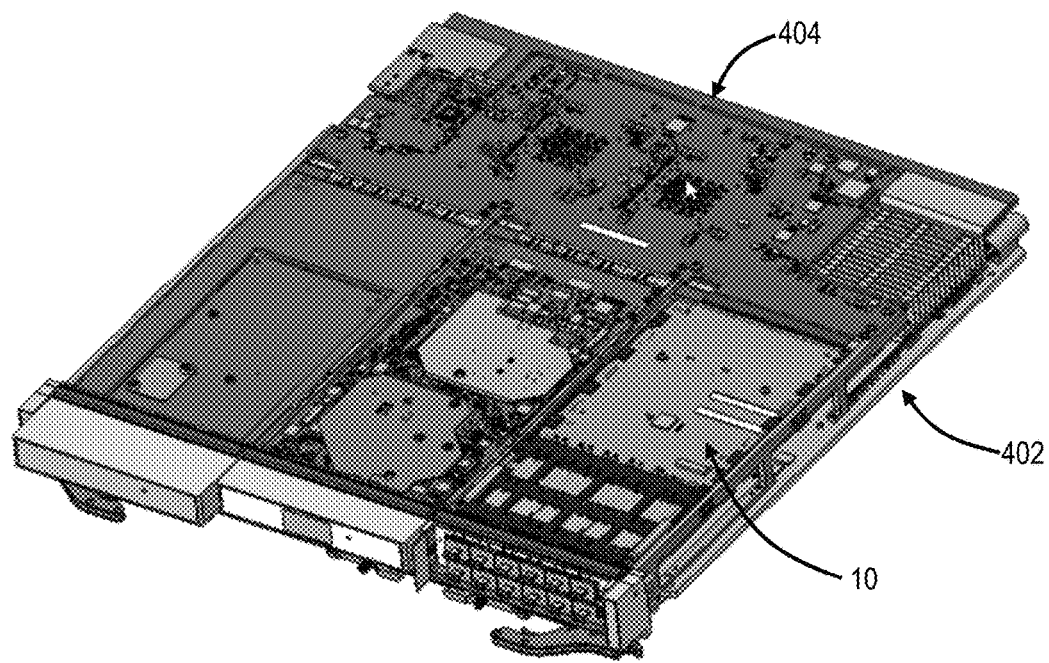
FIG. 17 is a diagram of a module that supports the USS and includes the host PCB and the mezzanine PCB.

Accordingly, the USS 10 (or any other FRU) can use a cabled assembly and mounting system approach described herein. This approach includes maximization of depth dimensions of the USS 10, ensuring very good signal integrity (SI) of the interconnected signals (up to 112G), eliminates the need for a co-planner interconnect mezzanine PCB which take space behind the USS 10, eliminates one set of connectors to get signals from the USS 10 to the host board which increases SI, and the like. This approach also allows for more direct, shorter overall trace lengths as the cables can land on the host PCB closer to the signal link end points. The connector pinout pin placement is designed to optimize this capability. The approach also allows for a test signal on a test board to be directly interconnected into the host board, for test loopback connectors to be used to loopback signals from the host board back to itself, and for a targeted re-work process should there be a problem with the USS 10 high speed connections (remove & replace single cable harness). FIG. 17 is a diagram of a module 400 that supports the USS 10 and includes the host PCB 402 and the mezzanine PCB 404.

The solution uses a connector solution where one side connects into a PCB (the USS 10 side) and where the other side has cables directly connected to the connector pins. These cables then interconnect directly to the host PCB 402 that will support the inserted FRU. This system uses less space and eliminates the one set of connectors which greatly increases SI of the high speed 112G data path signals.

Figure 18:
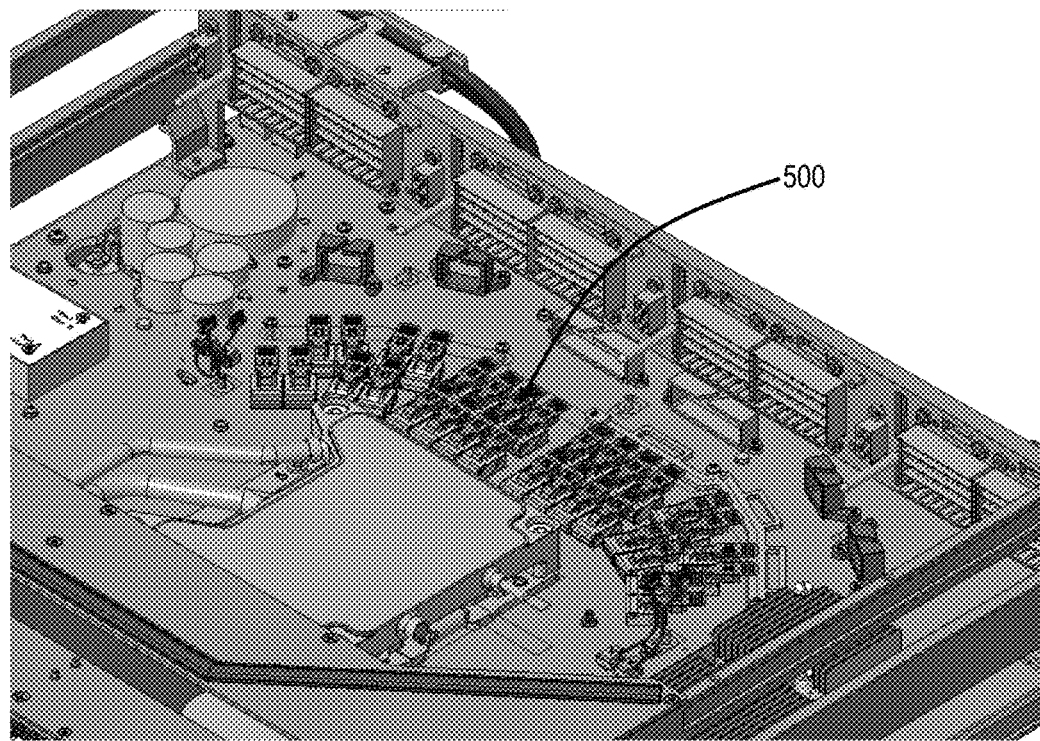
FIGS. 18, 19, and 20 are diagrams of a connector system for connecting the USS to the host.
Figure 19:
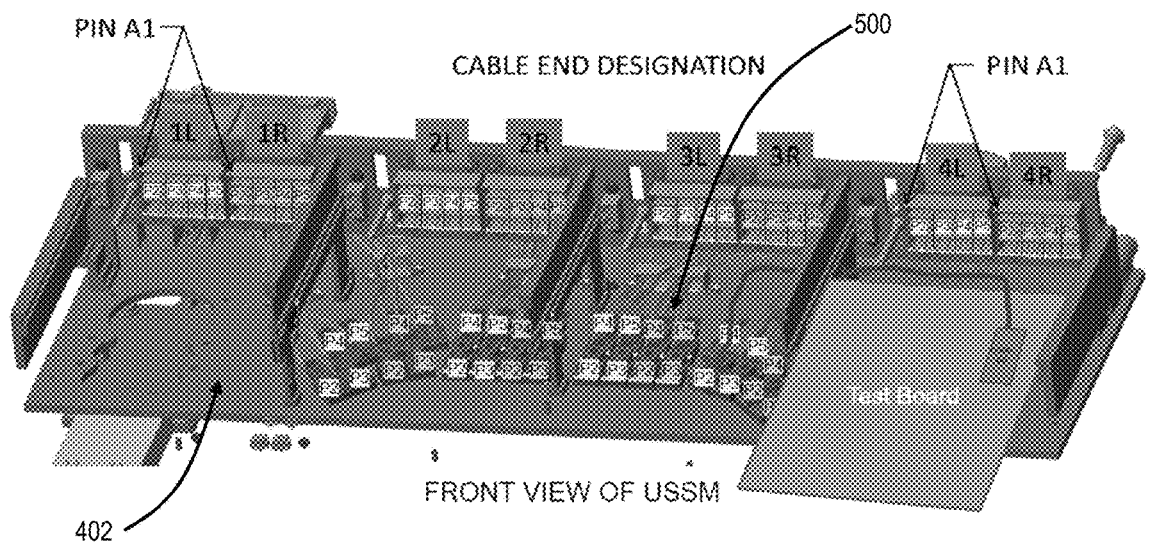
Figure 20:
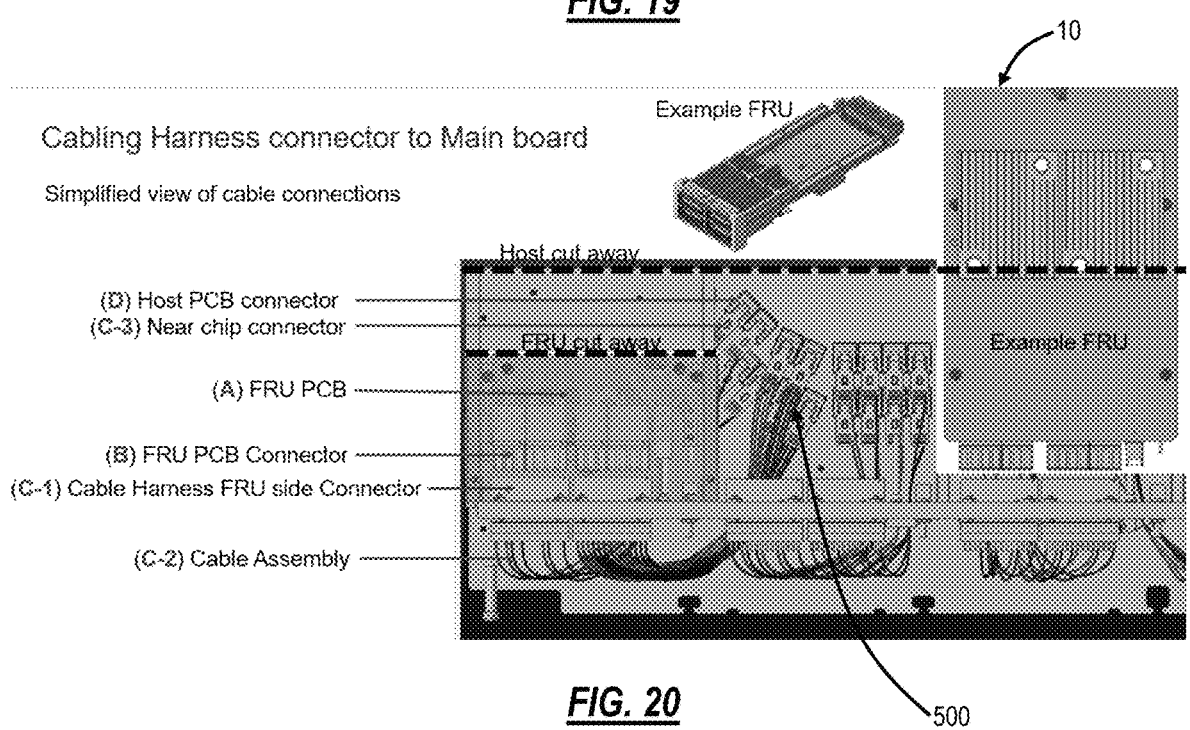

FIGS. 18, 19, and 20 are diagrams of a connector system 500 for connecting the USS 10 to the host PCB 402. In FIG. 17, it is seen the signal path from the USS 10 to the host PCB 402 runs over the mezzanine PCB 404 down to the host PCB 402, and on the host PCB 402 to corresponding circuitry. In FIG. 18, this path is significantly reduced where the connector system 500 is located near circuitry on the host PCB 402.

In FIG. 20, the connector system 500 includes a Field Replaceable Unit (FRU) PCB (A), a FRU mounted connector (B) (either with PCB traces or with direct cabled in signals), a cable harness (C), and Near chip connectors on the host card (D) that accept the cable harness connectors. The cable harness (C) includes a cable harness FRU side connector (C-1) mounted to a host card, a cable assembly (C-2), and a cable harness host side near chip connector (C-3) The FRU (aka the USS 10), PCB mounted connector, mates to the Cable harness connector.

CONCLUSION

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A universal sub slot module comprising:
a Printed Circuit Board (PCB) including circuitry for power, a data plane, and a control plane;
a faceplate connected to one end of the PCB and connectors connected to another end of the PCB, wherein the connectors are configured to connect to corresponding connectors in a host module; and
a form factor containing the PCB and configured to interface a sub slot in the host module configured to operate in a chassis-based or rack mounted unit network element, wherein the host module includes a plurality of sub slots, each being a port having one of the universal sub slot module and a filler module.

2. The universal sub slot module of claim 1, wherein the data plane is configured to implement one of Optical Transport Network (OTN), Beyond 100G, Flexible Optical (FlexO), Ethernet, and Flexible Ethernet (FlexE).

3. The universal sub slot module of claim 1, further comprising
housings for one or more pluggable optical interfaces.

4. The universal sub slot module of claim 3, wherein the one or more pluggable optical interfaces include a plurality of Quad Small Form-factor Pluggable (QSFP) interfaces or Small Form-factor Pluggable (SFP) interfaces.

5. The universal sub slot module of claim 1, wherein the circuitry includes any of a Ternary Content-Addressable Memory (TCAM), a statistics (STATS) gathering engine, and a Network Processing Unit (NPU).

6. The universal sub slot module of claim 1, wherein the circuitry further includes a timing plane.

7. The universal sub slot module of claim 1, wherein the control plane includes any of Peripheral Component Interconnect Express (PCIe), Ethernet (Serial Gigabit Media Independent Interface (SGMII)), SerDes Framer Interface (SFI), Inter-Integrated Circuit (I2C), Universal Asynchronous Receiver/Transmitter (UART), and Field Programmable Gate Array (FPGA) Serial Configuration lines.

8. The universal sub slot module of claim 1, wherein the connectors configured to connect to the corresponding connectors in the host module include a cable assembly.

9. A hardware module comprising:
a form factor configured to operate in a chassis-based or rack mounted unit network element, wherein the form factor includes a host Printed Circuit Board (PCB) and a plurality of sub slots, each connected to the host PCB, and each sub slot configured to receive one of a universal sub slot module and a filler module,
wherein the universal sub slot module includes
a Printed Circuit Board (PCB) including circuitry for power, a data plane, and a control plane;
a faceplate connected to one end of the PCB and connectors connected to another end of the PCB, wherein the connectors are configured to connect to corresponding connectors on the host PCB; and
a form factor containing the PCB and configured to interface a sub slot of the plurality of sub slots.

10. The hardware module of claim 9, wherein the filler module includes passive presence detection components.

11. The hardware module of claim 9, wherein the data plane is configured to implement one of Optical Transport Network (OTN), Beyond 100G, Flexible Optical (FlexO), Ethernet, and Flexible Ethernet (FlexE).

12. The hardware module of claim 9, wherein the universal sub slot module further includes
memory connected to the connectors and storing information related to the universal sub slot module, wherein the memory is configured to be accessible from the host module without powering the universal sub slot module.

13. The hardware module of claim 9, wherein the universal sub slot module further includes
housings for one or more pluggable optical interfaces.

14. The hardware module of claim 13, wherein the one or more pluggable optical interfaces include a plurality of Quad Small Form-factor Pluggable (QSFP) interfaces or Small Form-factor Pluggable (SFP) interfaces.

15. The hardware module of claim 9, wherein the circuitry includes any of a Ternary Content-Addressable Memory (TCAM), a statistics (STATS) gathering engine, and a Network Processing Unit (NPU).

16. The hardware module of claim 9, wherein the circuitry further includes a timing plane.

17. The hardware module of claim 9, wherein the control plane includes any of Peripheral Component Interconnect Express (PCIe), Ethernet (Serial Gigabit Media Independent Interface (SGMII)), SerDes Framer Interface (SFI), Inter-Integrated Circuit (I2C), Universal Asynchronous Receiver/Transmitter (UART), and Field Programmable Gate Array (FPGA) Serial Configuration lines.

18. The hardware module of claim 9, wherein the connectors configured to connect to the corresponding connectors in the hardware module include a cable assembly.

19. A universal sub slot module comprising:
a Printed Circuit Board (PCB) including circuitry for power, a data plane, and a control plane;
a faceplate connected to one end of the PCB and connectors connected to another end of the PCB, wherein the connectors are configured to connect to corresponding connectors in a host module;
a form factor containing the PCB and configured to interface a sub slot in the host module configured to operate in a chassis-based or rack mounted unit network element; and
memory connected to the connectors and storing information related to the universal sub slot module, wherein the memory is configured to be accessible from the host module without powering the universal sub slot module.

20. The universal sub slot module of claim 19, wherein the data plane is configured to implement one of Optical Transport Network (OTN), Beyond 100G, Flexible Optical (FlexO), Ethernet, and Flexible Ethernet (FlexE).

* * * * *